US006294771B2

(12) United States Patent
Katsuda et al.

(10) Patent No.: US 6,294,771 B2
(45) Date of Patent: Sep. 25, 2001

(54) ELECTRICALLY HEATED SUBSTRATE WITH MULTIPLE CERAMIC PARTS EACH HAVING DIFFERENT VOLUME RESITIVITIES

(75) Inventors: Yuji Katsuda, Tsushima; Kiyoshi Araki, Nagoya; Tsuneaki Ohashi, Ogaki, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/753,481

(22) Filed: Jan. 3, 2001

Related U.S. Application Data

(62) Division of application No. 09/218,701, filed on Dec. 22, 1998, now Pat. No. 6,204,489.

(30) Foreign Application Priority Data

Jan. 9, 1998 (JP) ........................................ 10-013518
Oct. 22, 1998 (JP) ........................................ 10-300736

(51) Int. Cl.[7] .......................... H01L 21/205; H01L 21/68

(52) U.S. Cl. ................... 219/544; 219/444.1; 219/468.1; 219/553; 118/725; 29/611

(58) Field of Search .................................... 219/544, 270, 219/553, 444.1, 468.1, 390, 405, 411; 392/416, 418; 118/724, 725, 728, 730, 500; 361/234; 29/611

(56) References Cited

U.S. PATENT DOCUMENTS

| | | | |
|---|---|---|---|
| 5,280,156 | 1/1994 | Niori et al. . | |
| 5,382,469 | 1/1995 | Kubota et al. . | |
| 5,566,043 | 10/1996 | Kawada et al. . | |
| 5,663,865 | 9/1997 | Kawada et al. . | |
| 5,665,260 | 9/1997 | Kawada . | |
| 5,777,543 | 7/1998 | Aida et al. . | |
| 5,800,618 | 9/1998 | Niori et al. . | |
| 5,811,761 | 9/1998 | Kita et al. . | |
| 6,204,489 * | 3/2001 | Katsuda et al. | 219/544 |

FOREIGN PATENT DOCUMENTS

| | | |
|---|---|---|
| 296 23 184 | 11/1997 | (DE) . |
| 6-232243 | 8/1994 | (JP) . |
| 7-50736 | 2/1995 | (JP) . |
| 8-97272 | 4/1996 | (JP) . |

* cited by examiner

*Primary Examiner*—John A. Jeffery
(74) *Attorney, Agent, or Firm*—Burr & Brown

(57) ABSTRACT

A heater comprising a substrate having a heating surface to treat a substance to be heated on the substrate, a heating element embedded in the substrate, and a resistance control part, wherein the substrate comprises a first ceramic material and the resistance control part comprises a second ceramic material which has higher volume resistivity than that of the first ceramics.

15 Claims, 8 Drawing Sheets

ELECTRICALLY HEATED SUBSTRATE WITH MULTIPLE CERAMIC PARTS EACH HAVING DIFFERENT VOLUME RESITIVITIES

CROSS REFERENCE TO RELATED APPLICATION

This is a divisional application of U.S. Ser. No. 09/218,701, filed Dec. 22, 1998, now U.S. Pat. No. 6,204,489, the entirety of which is incorporated herein by reference.

BACKGROUND OF THE INVENTION (1) Field of the Invention

This invention relates to a heater in which a heating element is embedded in a ceramic substrate and a method of manufacturing the same for treating a substance to be heated, such as semiconductor wafer.

(2) Related Art Statement

Attention is now paid to dense ceramics as a substrate for an electrostatic chuck. In equipment for manufacturing a semiconductor, a halogen corrosive gas such as $ClF_3$ is frequently used as an etching gas or a cleaning gas. Moreover, for rapidly heating and cooling a semiconductor wafer while holding it, it is desired that a substrate of an electrostatic chuck has a high heat conductivity and a thermal shock-resistance to prevent destruction due to rapid thermal changes. Dense aluminum nitride has high corrosive-resistance against the above halogen corrosion gas. Moreover, aluminum nitride is known as a material with high thermal conductivity with a volume resistivity of $10^{14}$ Ωcm or over at room temperature and high thermal shock-resistance. It is therefore considered preferable that a substrate of an electrostatic chuck as an equipment for manufacturing a semiconductor is formed of an aluminum nitride sintered body. It is proposed that a substrate of a ceramic heater or a heater with a built-in high frequency electrode is formed of an aluminum nitride.

NGK Insulators, Ltd. discloses in Japanese examined patent publication No. 7-50736 that a resistance heating element and an electrostatic chuck electrode are embedded in a substrate of aluminum nitride or a resistance heating element and an electrode for generating a high frequency are embedded therein.

When a resistance heating element and a high frequency electrode were embedded in a aluminum nitride substrate to make an electrode for generating high frequency waves and the electrode was operated at a high temperature, for example, 600° C. or over, the state of the high frequency waves or the state of the high frequency plasma often became unstable. Moreover, when a resistance heating element and an electrostatic chuck electrode were embedded in the aluminum nitride substrate to make an electrostatic chuck and the equipment was operated at a high temperature, for example, 600° C. or over, the electrostatic adsorption power in the electrostatic chuck became unstable locally or with the passage of time.

SUMMARY OF THE INVENTION

It is an object to stabilize the operational state in every portion of the heater or the operational state of the heater with the passage of time, the heater comprising a substrate of a ceramic material, a heating element embedded in the substrate, and a heating surface for dealing with a substance to be heated on the substrate.

This invention relates to a heater comprising a substrate having a heating surface to treat a substance to be heated on the substrate, a heating element embedded in the substrate, and a resistance control part, wherein the substrate comprises a first ceramic material and the resistance control part comprises a second ceramic material which has higher volume resistivity than that of the first ceramic material.

This invention also relates to a method of manufacturing the above heater comprising the steps of preparing a substrate preform to be sintered as a ceramic substrate, providing a part to be sintered as a resistance control part in the substrate, and hot-pressing and sintering the substrate preform and the part.

The present inventors investigated causes of generating the instability in, for example, the high frequency condition of the high frequency electrode. As a result, they found that leak current, which flows between the heating element in the substrate and the high frequency electrode, disturbs the high frequency condition.

To solve the problem, they found that a resistance control part which is formed of a second ceramic material having a higher volume resistivity than that of a first ceramic material of the substrate is provided in the substrate and thereby the influence of the leak current is restrained or controlled. They reached this invention based on the above discovery.

It is particularly known that the volume resistivity of aluminum nitride shows a behavior like a semiconductor and decreases with an increase in temperature. According to this invention, by using aluminum nitride as a resistance control part, the high frequency condition and electrostatic adsorption power even at a range of 600 to 1200° C. can be stabilized.

The above resistance control part is preferably in a layer-like form, and thereby the leak current can be restrained over a wide range of the heating surface of the substrate.

BRIEF DESCRIPTION OF THE DRAWINGS

For a better understanding of the invention, reference is made to the attached drawings, wherein.

DETAILED DESCRIPTION OF THE INVENTION

Figure 1:
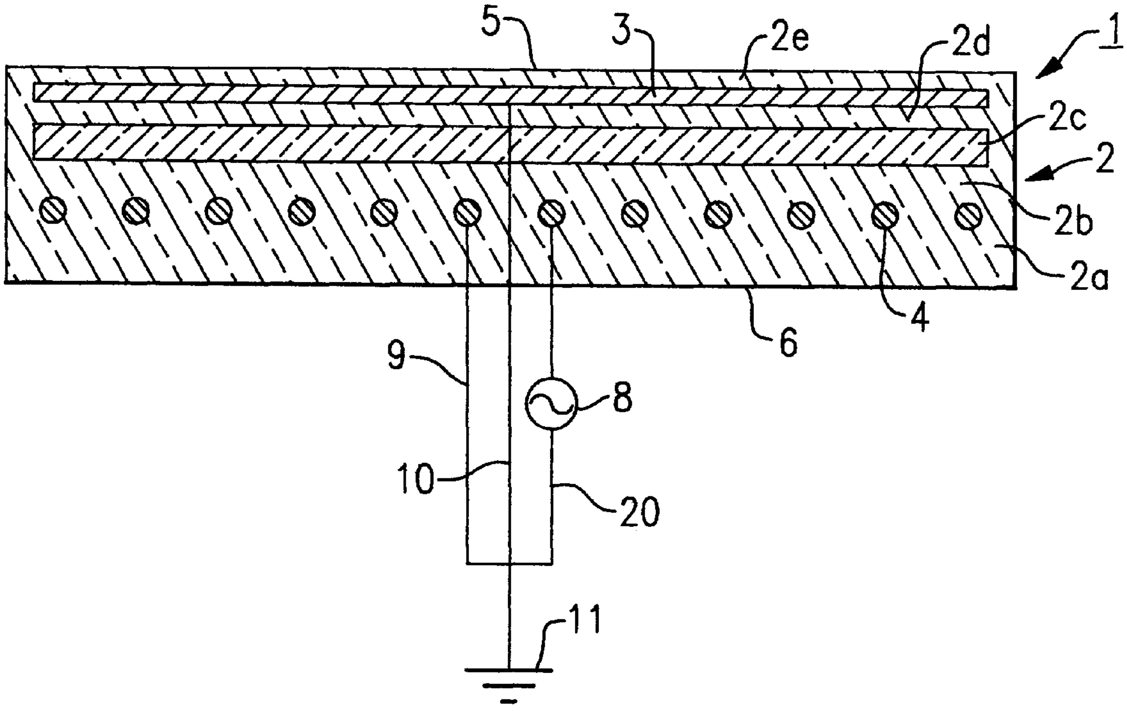
FIG. 1 is a cross sectional view schematically showing a heater 1 as an embodiment according to this invention.
Figure 2:
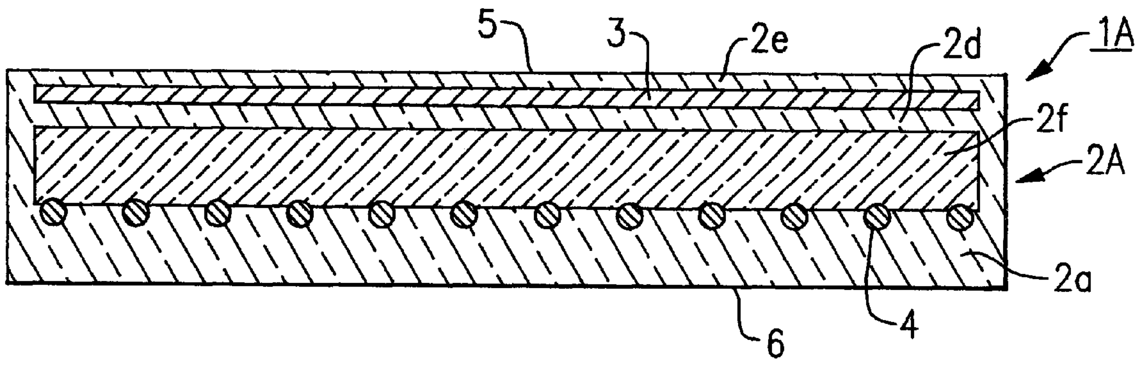
FIG. 2 is a cross sectional view schematically showing a heater 1A as another embodiment according to this invention.

In this invention, more particularly, another conducting part is embedded in the substrate between the resistance control part, particularly preferably the resistance control layer (the layer-like resistance control part) and the heating surface of the substrate. A high frequency wave-generating electrode or an electrostatically chucking electrode is preferably used as the conducting part. FIGS. 1 and 2 are cross sectional views for schematically showing a heating equipment of this example.

In the heating equipment 1 shown in FIG. 1, a discoidal substrate 2 has a heating surface 5 and back surface 6, ceramic layers 2*a*, 2*b*, 2*c*, 2*d*, and 2*e* are provided between the heating surface 5 and the back surface 6, a resistance heating element 4 is embedded in between ceramic layers 2*a* and 2*b*, and a conducting part 3 is embedded in between ceramic layers 2*d* and 2*e*. Moreover a resistance control layer 2*c* made of a ceramic material having a relatively high volume resistivity.

The substrate is constituted by the ceramic layers 2*a*, 2*b*, 2*d* and 2*e*. These ceramic layers are preferably made of the same ceramic material, although their materials differs from each other so long as the intended object of the present invention is not lost. The ceramic layer 2*c* is made of another ceramic material having volume resistivity higher than that of the ceramic layers 2*a*, 2*b*, 2*d* and 2*e*.

FIG. 2 shows another heating equipment 1A in which ceramic layers 2*a*, 2*f*, 2*d*, and 2*e* are provided in between a heating surface 5 and a back surface 6, a resistance heating element 4 is embedded in between the ceramics 2*a* and 2*f*, and a conducting part 3 is embedded in between the ceramic layer 2*d* and 2*e*.

In the example of FIG. 1, the resistance heating element 4 is embedded between the ceramic layers 2*a* and 2*b* made of a first ceramic material, and is not contacted with the resistance control layer 2*c*. In the example of FIG. 2, the resistance heating element 4 is provided alongside the boundary surface between the ceramic layer 2*a* and the resistance control layer 2*f*, and is contacted with the resistance control layer 2*f*.

Figure 3:
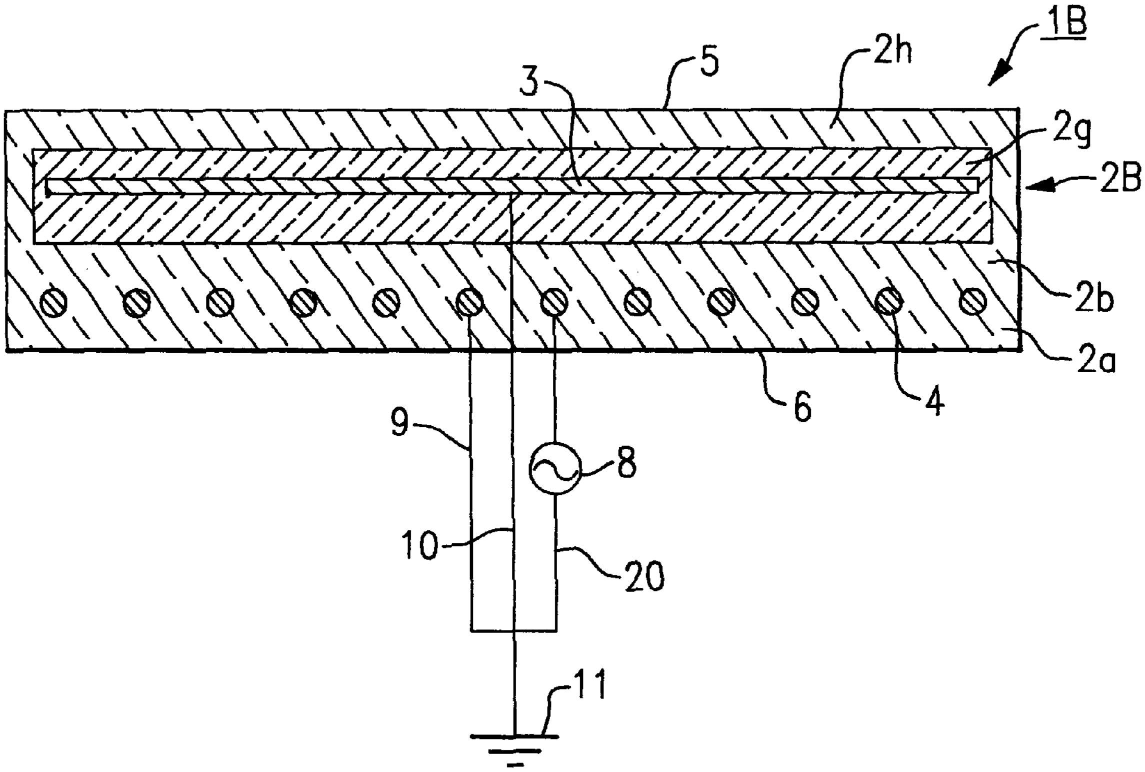
FIG. 3 is a cross sectional view schematically showing a heater 1B in still another example according to this invention.
Figure 4:
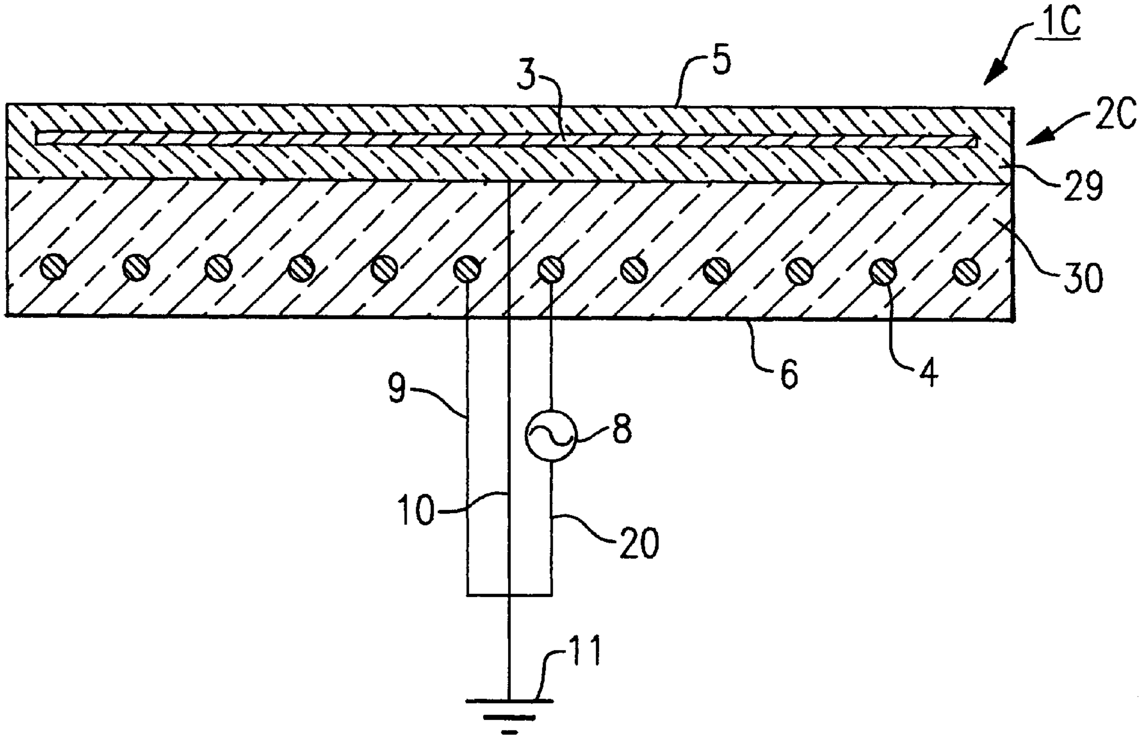
FIG. 4 is a cross sectional view schematically showing a heater 1C in a further embodiment according to this invention.

In another example, an electrode is embedded in a uniform resistance control part and thereby heat expansion and heat shrinkage around the electrode can become uniform. FIGS. 3 and 4 relate to such an example.

In a heating equipment 1B of FIG. 3, a substrate 2*b* is constituted by ceramics layers 2*a*, 2*b*, 2*g*, and 2*h*. A heating element 4 is embedded between the ceramic layers 2*a* and 2*b*, and a resistance control part 2*g* is included in between the ceramic layers, and embedded therein. Moreover a conducting part 3 is embedded in the resistance control part 2*g*. In this example, the resistance control part 2*g* is not exposed on the surface of the substrate 2B, but its peripheral surface may be exposed on a peripheral surface of the substrate 2B.

Alternatively, it may be that a resistance control part is provided as a surface layer of the substrate, and a ceramic layer is provided under this surface layer. In that case, a heating element is preferably embedded in the underside layer of the resistance control part, and a conducting function part is preferably embedded in the surface layer (the resistance control part).

FIG. 4 is a cross sectional view schematically showing a heating equipment 1C of the above alternative example. A substrate 2C is composed of a resistance control part (a surface layer) 29 and a backside surface layer 30. A heating element 4 is embedded in the backside surface layer 30, and a conducting part 30 is embedded in the surface layer 29.

In this invention, a heating element is particularly preferably embedded in the backside surface layer made of a given single ceramic material. By so doing, the distortion of the backside surface layer around the heating element is restrained and thereby the destruction of the substrate is prevented when the temperature of the heating element increases or decreases.

According to this invention, the leak of the current to the conducting part 3 from the resistance heating element can be prevented and thereby the temperature of each part of the heating surface 5 can remain stable. Consequently a highly uniform temperature distribution of the heating surface of the substrate can be attained in the case of putting a semiconductor wafer etc. on the heating surface.

In this invention, aluminum nitride, silicon nitride, silicon oxide, aluminum oxide, magnesium oxide, yttrium oxide or the like may be used as the first ceramic material for the substrate. Particularly nitride-based ceramic material may be used, more particularly aluminum nitride-based ceramic material may be used.

Moreover the resistance control part is made of second ceramic material different from that of the substrate. As the main component of the second ceramic material, alumina, silicon nitride, boron nitride, magnesium oxide, silicon oxide, or yttrium oxide can be also used. In that case, the wording "main component" means that the component is contained in the ceramic material at 90 wt % and over relative to the whole weight of the other material. Particularly a resistance control part is preferably formed of a ceramic material whose main component is alumina, silicon nitride, boron nitride, silicon oxide, or yttrium oxide.

It is effective in controlling the temperature distribution that the second ceramic material has lower heat conductivity than that of the first ceramic material of the substrate.

In the case that an aluminum nitride-based ceramic material is employed for both the first ceramic material and the second ceramic material, the resistance control part may be produced by adding a given amount of magnesium and/or lithium into the aluminum nitride-based ceramic material to increase its volume resistivity, while the substrate itself is made of aluminum nitride. Such example is described hereinafter.

(1) Production of a resistance control part by adding a given amount of magnesium into a second ceramic material as the main component of the resistant control part.

Aluminum nitride in the aluminum nitride-based ceramic material is required to be contained in such an amount that enables particles of aluminum nitride to exist therein as the main phase. The content of aluminum nitride is preferably 30 wt % or, particular 50 wt % or over.

If magnesium is incorporated into the aluminum nitride-based ceramic material in an amount of 0.5 wt % or over as calculated in the form of its oxide, its volume resistivity increases and the resistance control part has a high anti-corrosion property against corrosive halogen gas. Accordingly, in the case of forming the resistance control part of the aluminum nitride-based ceramic material, it can have a high anti-corrosion property and prevent the leak current.

The content of magnesium in the second ceramic material is not limited, but is preferably 30 wt % or less as calculated in the form of the oxide at the time of manufacturing the resistance control part. Since a coefficient of heat expansion of the resulting sintered body rises as the amount of contained magnesium increases, its content is preferably 20 wt % or less so that the coefficient of heat expansion in the sintered body of the aluminum nitride-based ceramic material in the present invention may approach that of a sintered body of aluminum nitride having no magnesium.

The constituting phase of the second ceramic material may be a single phase of aluminum nitride into which magnesium is solid solved or a combination of such an aluminum nitride single phase and a precipitated phase of magnesium oxide.

The coefficient of thermal expansion of the aluminum nitride single phase to which magnesium is solid solved, is close to that of aluminum nitride containing no magnesium. Therefore, when the resistance control part is integrally sintered together with the substrate, heat stress is relaxed and the destruction of the ceramics does not occur from the magnesium oxide phase as a starting point.

In the case that the magnesium oxide phase is precipitated, the anti-corrosion property of the resistance control part can be further enhanced. Generally in the case that the second phase is dispersed into an insulating material, a resistivity of the insulating material decreases when the second phase has lower resistivity. In the case that the constituting phase of the second ceramic material is AlN+MgO, however, since MgO itself has high volume resistivity, the volume resistivity of the ceramic material does not decrease disadvantageously.

(2) Production of a resistance control part by incorporating a given amount of lithium into the aluminum nitride-based ceramic material.

The present inventors found that the volume resistivity of the aluminum nitride-based ceramic material in a high temperature range, particularly in a high temperature range of 600° C. and over, is remarkably enhanced by adding a very small amount, 500 ppm or less, of lithium into it. By forming a resistance control part of this aluminum nitride-based ceramic material, the leak current can be effectively prevented when heating up the heater. Since lithium is added in such a very small amount of 500 ppm or less, the heater can be preferably used as an equipment for manufacturing semiconductors in which metal pollution is not undesirable in particular.

Aluminum nitride in the second aluminum nitride-based ceramic material is required to be contained in such an amount that enables particles of aluminum nitride to exist therein as the main phase. The content of aluminum nitride is preferably 30 wt % or over, particular 50 wt % or over. The polycrystalline structure in the aluminum nitride crystals may contain a very small amount of another crystalline phase, for example, lithium oxide phase except the aluminum nitride crystals.

In the case that the content of contained lithium was 500 ppm or less, no phase except aluminum nitride phase could be observed. On the contrary, in the case of adding a large amount of lithium into aluminum nitride, peaks of lithium aluminate and lithium oxide could be observed by an X-ray diffraction method. These results show that in the aluminum nitride-based ceramic material containing lithium, at least part of the lithium may solid-solve in the lattice of the aluminum nitride and lithium aluminate or lithium oxide may precipitate as small crystals which could not be observed by the X-ray diffraction method.

The reason why the aluminum nitride has a high volume resistivity at high temperature enhanced by adding lithium into it is not clear, but it is considered that at least part of the lithium may solid solve into aluminum nitride and compensate lattice defects of the aluminum nitride.

In the case that the second ceramic material is formed of the above aluminum nitride-based ceramic material containing magnesium or lithium added and the first ceramic material is formed of another aluminum nitride-based ceramic material, the amount of a metal contaminant (except lithium and magnesium) in the first ceramic material is preferably 1000 ppm or less.

In manufacturing a heating equipment of this invention, a ceramic substrate to be sintered is prepared, a resistance control part is provided in the ceramic substrate, and the ceramic substrate is hot-pressed.

The pressure in hot pressing is preferably 20 kgf/cm$^2$ or over, particularly 100 kgf/cm$^2$ or over. The upper value is not limited, but is preferably 1000 kgf/cm$^2$ or less from the practical standpoint of view, particular preferably 400 kgf/cm$^2$ or less to prevent the damage of a ceramic equipment such as a mold.

After the hot pressing, aluminum oxynitride or aluminum oxide is preferably formed at the interface between the resistance control part and the substrate made of the first ceramic material so that adherence may be further improved at the interface therebetween. AlON, SiAlON, or Y—Al—O is preferably used as the above compound.

Although the conducting part embedded in the sintered body of the aluminum nitride may be formed of a conductive film by printing, it is preferably formed of a planar bulk metal material. The wording "bulk metal" means a bulk extending two-dimensionally formed of metal wires or a metal board.

A metal member is preferably formed of a metal having a high melting point, such as Ta, W, Mo, Pt, Re, Hf or an alloy composed of these metals. A semiconductor wafer or aluminum wafer etc. may be used as a substance to be treated.

This invention will be described in more detail with reference to the following specific experiments.

EXAMPLE 1

A heating equipment as shown in FIG. 1 was prepared. Concretely, aluminum nitride powder, which was produced by a reduction nitriding method, was used, and a binder of acrylic resin was added to the powder. The mixture was granulated by a spray granulator, thereby obtaining granulated particles. On the other hand, alumina powder was molded in the form of a tape to obtain an alumina sheet with 320 $\mu$m in thickness. As shown in FIG. 1, layers of molded bodies thus obtained were successively uniaxially press molded and stacked to be integrated, while a resistance heating element 4 of Mo having a coil-shaped form and an electrode 3 were embedded inside the integrated layers. A wire gauze made by weaving Mo wires with 0.4 mm in diameter at a density of 24 lines at 1 inch, was used as the electrode 3.

This molded body was put in a hot-press mold, which was sealed. The mold was heated at a rate of 300° C./hour while the interior therein was evacuated in a temperature range of room temperature to 1000° C. The pressure was increasing with increase in temperature. It was held at a maximum temperature of 1800° C. for 4 hours, hot-pressed at 200 kgf/cm$^2$ in a nitrogenous atmosphere, thereby obtaining a sintered body. This sintered body was machined and finished, thereby obtaining a heater. The diameter and the thickness of a substrate were 240 mm and 18 mm, respectively. The distance between the resistance heating element 4 and a heating surface 5 of the substrate was 6 mm and the thickness of an insulated dielectric layer 2e was 1 mm.

Figure 5:
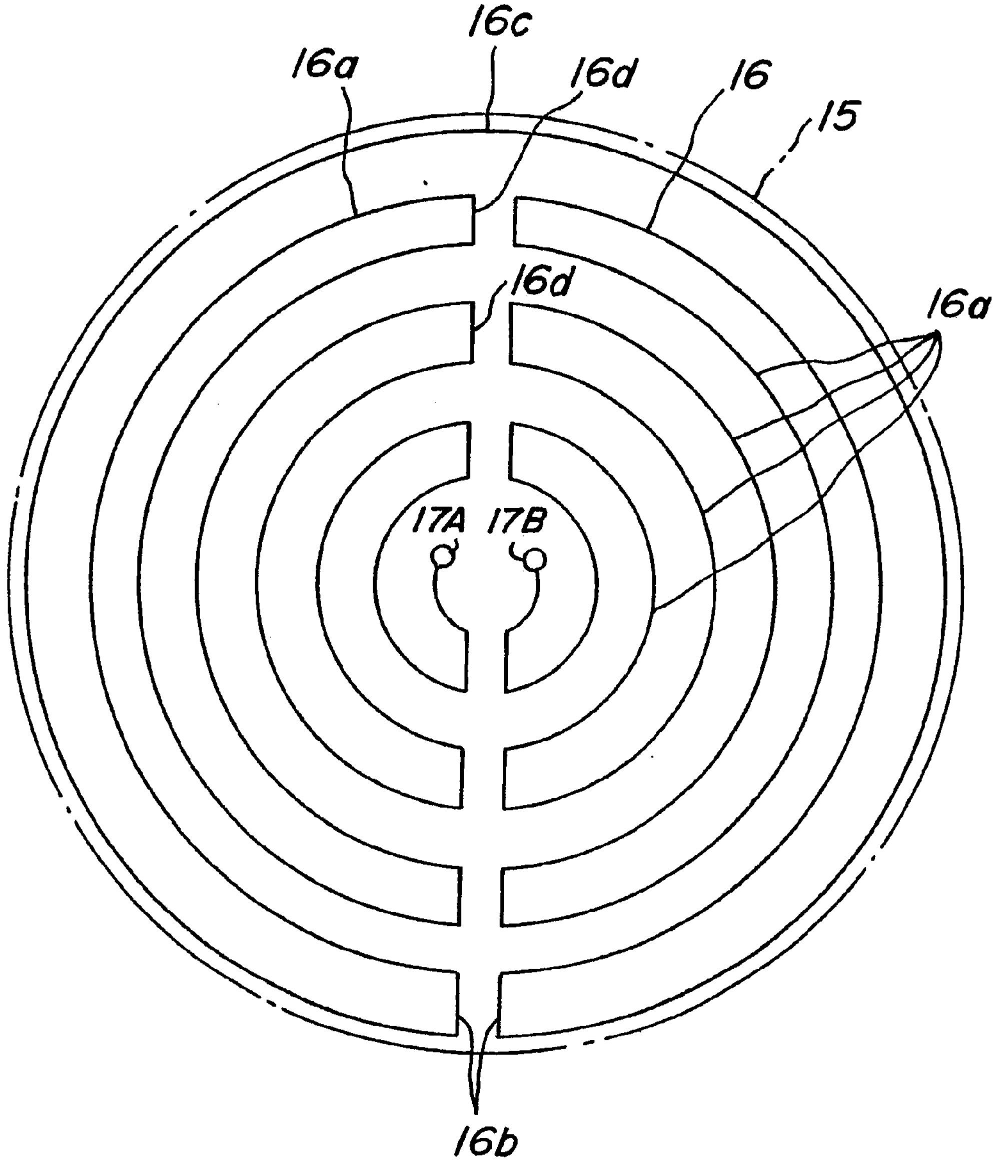
FIG. 5 is a plan view showing an embedded pattern of a resistance heating element in a heater made in an experiment according to this invention.

The embedded plane shape of the resistance heating element was as shown in FIG. 5. That is, a winding body 16 was obtained by winding the Mo wire, and terminals 17A and 17B were joined to the ends of the winding body 16. The whole winding body 16 was arranged in almost line symmetry to a line vertical to the paper in which FIG. 5 was drawn. Plural concentric circular parts 16*a* having different diameters were arranged in line symmetry, and the concentric circular parts 16*a* neighboring each other in a diametrical direction of the concentric circles were connected with each other by a connecting portion 16*d*. A connecting part 16*b* at the outermost periphery was connected to a circular part 16*c* almost surrounding the outermost periphery. Twin terminals 17A and 17B were connected each other in series with the winding body 16. The terminals 17A and 17B were accommodated in a protector tube (not shown).

Next, a circuit shown in schematic in FIG. 1 was made. That is, a high frequency power supply 8 for supplying electric power was connected to the resistance heating element 4 through an electric wire 9, and the electrode 3 was connected to a ground 11 through an electric wire 10. A leak current of the electrode 3 from the resistance heating element 4 was measured by connecting the electric wires 20 and 9 to a clamp meter at 500, 600, and 700° C. in vacuum. As an operation index of the conducting part, the distribution of the surface temperature of the heating surface 5 was measured with a thermo-viewer at an operation temperature of 700° C., and thereby a difference between maximum temperature and minimum temperature in the heating surface was measured.

Figure 6:
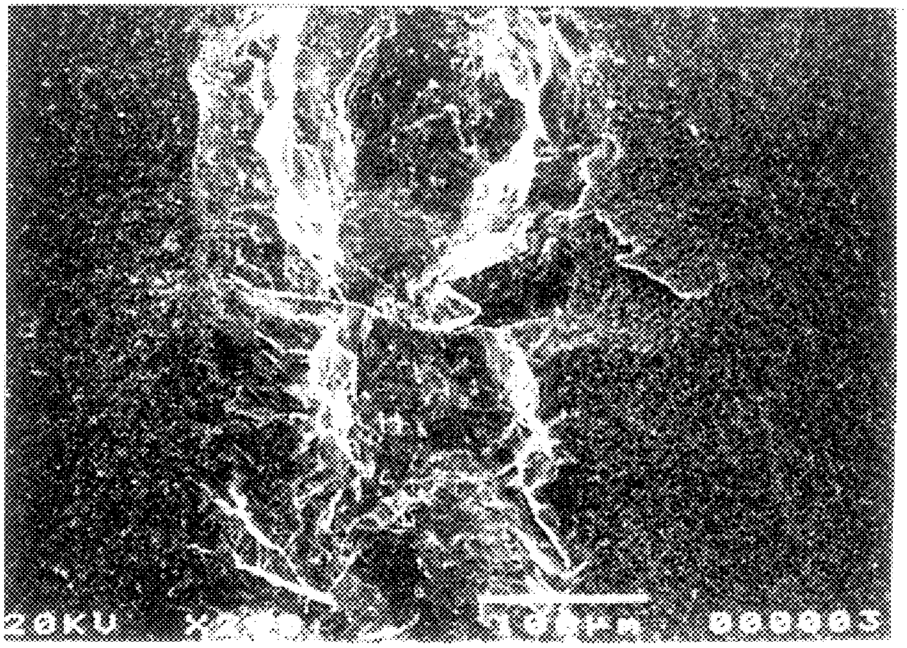
FIG. 6 is a scanning electron microscope photograph showing a ceramic tissue near an interface between a resistance control layer and aluminum nitride.
Figure 7:
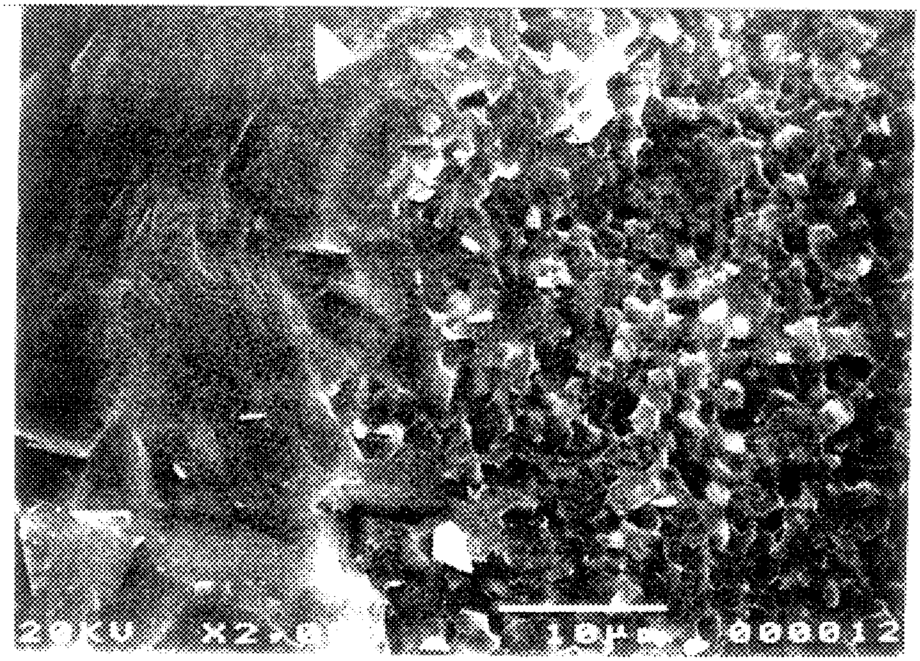
FIG. 7 is a scanning electron microscope photograph showing in an enlarged scale a ceramic tissue near an interface between an aluminum nitride phase and AlON phase.

As a result, the leak current was not observed, and the temperature difference in the heating surface was 10° C. The thickness of the resistance control layer was 150 μm, and was composed of α-alumina phases. An AlON phase was generated at an interface between the resistance control layer and the aluminum nitride. FIG. 6 is a photograph of a scanning electron microscope, showing a ceramic tissue in an area near the interface between the resistance control layer and the aluminum nitride. The AlON phase is formed between the uniform aluminum nitride phases. FIG. 7 shows in an enlarged scale an area near an interface between the aluminum nitride phases and the AlON phase. The interfaces between these different ceramic phases are in succession, and abnormality such as peeling-off or cracks is not observed in the interface.

EXAMPLE 2

A heater 1 was made as in the Example 1, and experiments were also carried out as in the Example 1 except for putting alumina powder was used instead of an alumina sheet at the time of uniaxial press molding.

As a result, no leak current was observed at each temperature, and the temperature difference in a heating surface was 10° C. The thickness of a resistance control layer was 220 μm. The resistance control layer was composed of α-alumina phases, and an AlON phase was generated in the interface between the resistance control layer and aluminum nitride.

EXAMPLE 3

A heater was made as in the Example 1, and experiments were also carried out as mentioned above, except silicon nitride powder was used instead of an alumina sheet at the time of uniaxial press molding.

As a result, no leak current was observed at 500° C. On the other hand, the leak current at 600° C. was 1 mA and the leak current at 700° C. was 8 mA. The temperature difference in a heating surface was 15° C. The thickness of a resistance control layer was 240 μm. The resistance control layer was composed of silicon nitride phases and a product which could not be specified existed in an interface of between the resistance control layer and aluminum nitride.

EXAMPLE 4

A heater was made as in the Example 1, and experiments were also carried out as in mentioned above, except silicon oxide powder was used instead of an alumina sheet at the time of uniaxial press molding.

As a result, no leak current was observed at 500° C. On the other hand, the leak current at 600° C. was 3 mA and the leak current at 700° C. was 10 mA. The temperature difference in a heating surface was 15° C. The thickness of a resistance control layer was 210 μm. The resistance control layer was composed of silicon oxide phases, and a product which could not be specified existed in an interface between the resistance control layer and aluminum nitride.

EXAMPLE 5

A heater was made as in the Example 1, and experiments were also carried out as mentioned above, except yttrium oxide powder was used instead of an alumina sheet at the time of uniaxial press molding.

As a result, no leak current was observed at 500 and 600° C. On the other hand, the leak current at 700° C. was 3 mA. The temperature difference in a heating surface was 10° C. The thickness of a resistance control layer was 190 μm. The resistance control layer was composed of yttrium oxide phases, and an $Al_2Y_4O_9$ phases existed in an interface of between the resistance control layer and aluminum nitride.

EXAMPLE 6

A heater was made as in the Example 1, and experiments were also carried out as mentioned above, except boron nitride powders were used instead of an alumina sheet at the time of uniaxial press molding.

As a result, no leak current was observed at 500 and 600° C. On the other hand, the leak current at 700° C. was 2 mA. The temperature difference in a heating surface was 10° C. The thickness of a resistance control layer was 130 μm. The resistance control layer was composed of boron nitride phases and a product which could not be specified existed in an interface between the resistance control layer and aluminum nitride.

Comparative Example 1

A heater was made as in the Example 1, and experiments were also carried out as mentioned above, except for using an alumina sheet at the time of uniaxial press molding As a result, leak currents at 500, 600, and 700° C. were 2 mA, 9 mA and 45 mA, respectively. The temperature difference in a heating surface was 50° C.

EXAMPLE 7

A heater as shown in FIG. 3 was made as in Example 1.

A resistance control layer was formed of the granulated particles made as follows. A given amount of aluminum nitride powder made by reduction nitriding method, 1.0 wt % of MgO, and a suitable amount of an acrylic resin binder were added into an given amount of isopropyl alcohol, and they were mixed by a pot mill. The mixture was, thereafter, dried and granulated by a spray granulator, thereby obtaining the granulated particles. An electrode 3 was embedded in the particles. A wire gauze made by weaving Mo wires with 0.4 mm in diameter at a density of 24 wires per inch, was used as the electrode 3. The particles having the electrode 3 therein were uniaxially press molded and thereby a discoidal molded body was obtained. Molded bodies thus obtained were stacked and were uniaxially press molded to obtain a compact having a shape as shown in FIG. 3.

This resulting molding was put in a hot-press mold, which was sealed. The mold was heated at a rate of 300° C./hour while its interior was evacuated in the range of room temperature to 1000° C. and the pressure thereof was increased. It was held at maximum temperature of 1800° C. for 4 hours, hot-pressed at 200 $kgf/cm^2$ in a nitrogenous atmosphere, and thereby a sintered body was obtained. This sintered body was machined, and finished, thereby obtaining a heater. The diameter and the thickness of a substrate were 240 mm and 18 mm, respectively. The distance between a resistance heating element 4 and a heating surface 5 was 6 mm.

No leak current to the electrode 3 from the heating element 4 was observed at 500, 600, 700, and 800° C. in vacuum. The difference between the maximum temperature and the minimum temperature was 10° C. at an operation temperature of 800° C.

Moreover, a corrosion-resistance test was carried out for the heater. The heater was put in a chamber filled with a halogen gas ($Cl_2$ gas: 300 sccm, $N_2$ gas: 100 sccm, the pressure of the chamber: 0.1 torr), and a high frequency plasma of an inductive coupling plasma method was generated on the heating surface of the substrate by supplying an electric power to the resistance heating element 4 and holding the temperature of the heating surface 5 at 735° C. An etching rate was measured from a change in weight of the heater after exposing it to the plasma for 24 hours. As a result, the etching rate was 4.4 μm/hour. Accordingly, the susceptor according to the present invention can be used as a heater which operates at higher temperatures than a conventional susceptor.

A sample was cut from a ceramic layer 2*h*, and an amount of metal impurity therein was measured by wet-chemical analysis. As a result, the amount was not more than 100 ppm. A sample was cut from a resistance control part 2*g*, and a amount of magnesium therein was measured. In consequence, the amount was 0.50 wt %.

EXAMPLE 8

A heater as shown in FIG. 4 was made as in Example 1.

A given amount of aluminum nitride powders made by reduction nitriding method, MgO of 2.0 wt %, and a suitable amount of acrylic binder were added into an given amount of isopropyl alcohol, and they were mixed by a pot mill. The mixture was, thereafter, dried and granulated by a spray granulator, thereby forming the granulated particles. An electrode 3 as shown in Example 7 was embedded in the granulated particles, and thereby a molded body as a surface layer 29 was obtained. Molded bodies thus obtained were stacked and uniaxially press molded, thereby obtaining a molded body having a configuration shown in FIG. 4. The resulting molding was hot-pressed and sintered as in Example 7. The dimensions of the sintered body were the same as those of Example 7.

No leak current to the electrode 3 from the resistance heating element 4 was observed at 500, 600, 700 and 800° C. in vacuum. The difference between the maximum temperature and the minimum temperature was 10° C. at an operation temperature of 800° C. The etching rate which was. measured to be 4.3 μm/hour under the same condition as in Example 7.

A sample was cut from the surface layer 29, and an amount of magnesium therein was measured. As a result, the amount was 1.1 wt %.

EXAMPLE 9

A heater as shown in FIG. 4 was made as in Example 1.

A resistance control layer was formed of granulated particles made as follows. A given amount of aluminum nitride powder made by reduction nitriding method, 0.1 wt % of lithium carbonate as calculated in the form of its oxide, and a suitable amount of acrylic resin binder are added into an given amount of isopropyl alcohol, and they were mixed by a pot mill. The mixture was, thereafter, dried and granulated by a spray granulator, and the granulated particles were uniaxially press molded. An electrode 3 was embedded in the molded body. Molded bodies thus obtained were stacked as in the Example 7.

The laminate was fired as in Example 7 and tested. As a result, no leak current was observed at 500, 600, and 700° C., and a leak current at 800° C. was 1 mA. The difference in the temperature of a heating surface was 10° C.

A sample was cut from a back surface 30 and an amount of metal impurity was measured by wet-chemical analysis. In consequence, the amount was not more than 100 ppm. A sample was cut from a resistance control part (surface layer) 29, and an amount of lithium therein was measured to be 280 ppm.

According to a shape of a heating element in a substrate, the leak current from the heating element may be concentrated at an area other than an area between the heating surface and the heating element. In that case, it is desirable that the resistance control part is provided in the area in which at least leak current is concentrated.

Figure 8:
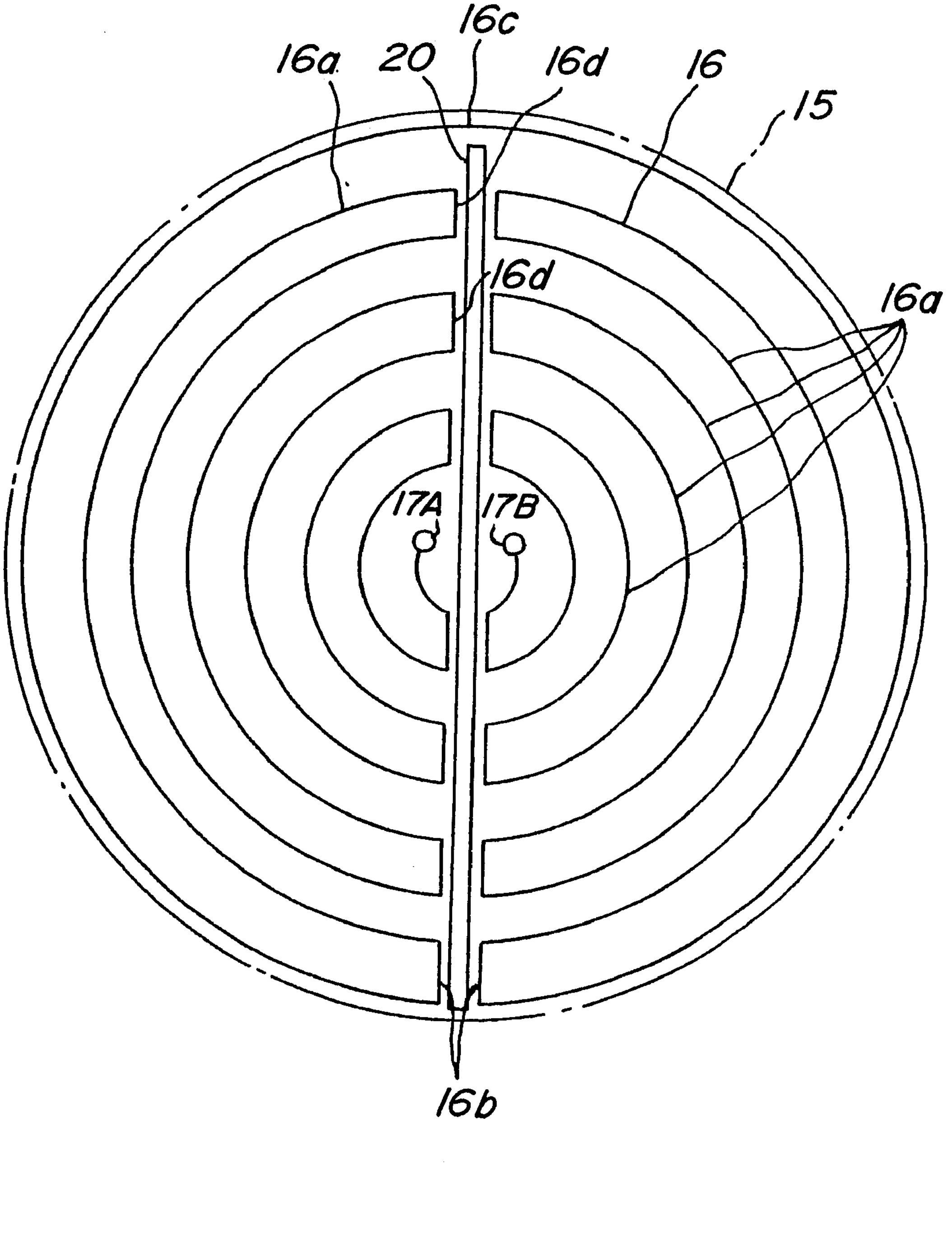
FIG. 8 is a plan view typically showing a heater as a still further embodiment according to this invention.

For example, in a heating element 16 having a plane pattern as shown in FIG. 8 (i.e. FIG. 5), it was found that a leak current was generated nearby connecting parts 16*b* and 16*d* between a righthand resistance heating element and a lefthand resistance heating element in FIG. 8, in particular. The leak current was concentrated at the area nearby the connecting parts and thereby hot spots was formed around the area. It degrades the uniformity of the temperature in the heating surface.

The formation of the hot spots can be prevented by providing a resistance control layer 20 and thereby preventing a leak current between the resistance heating elements according to this invention. Since the area in which the above leak current intends to be generated changes depending on the shape of a resistance heating element, at least resistance control part is provided at least in the area in a substrate in which a relatively large potential slope is generated.

A shape of a resistance control part is not limited to the above plane shape. For example, in FIG. 9(*a*), when there is an area 21 in which potential difference occurs between resistance heating elements 16 in a substrate 15, a leak current is prevented by providing a resistance control layer 20A in the area 21. By making the shape of the resistance control layer 20A substantially vertical to the extending plane of the resistance heating elements 16, the leak current can be more assuredly prevented.

Figure 9A:
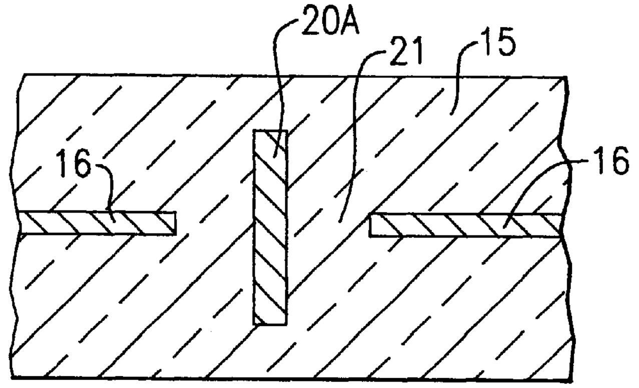
FIG. 9(*a*) is a cross sectional view showing a state that a resistance control layer 20A is provided in an area between portions of a resistance heating element 16, FIG. 9(*b*) is a cross sectional view showing a state that a resistance control layer 20B is obliquely provided in an area between portions of a resistance heating element 16, and FIG. 9(*c*) is a cross sectional view showing a state that a resistance control layer 20C is provided in an area between portions of a resistance heating element 16.
Figure 9B:
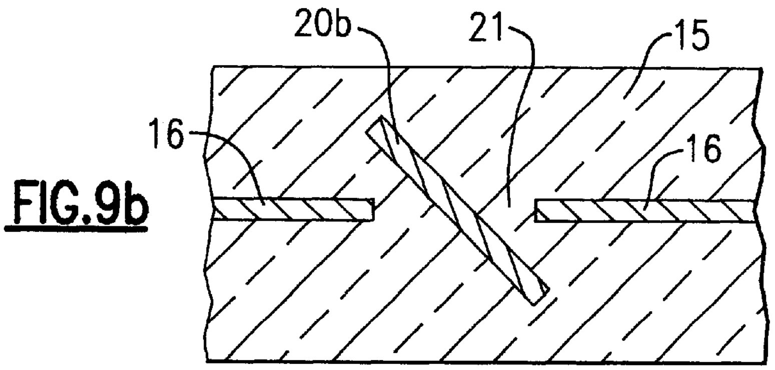
Figure 9C:
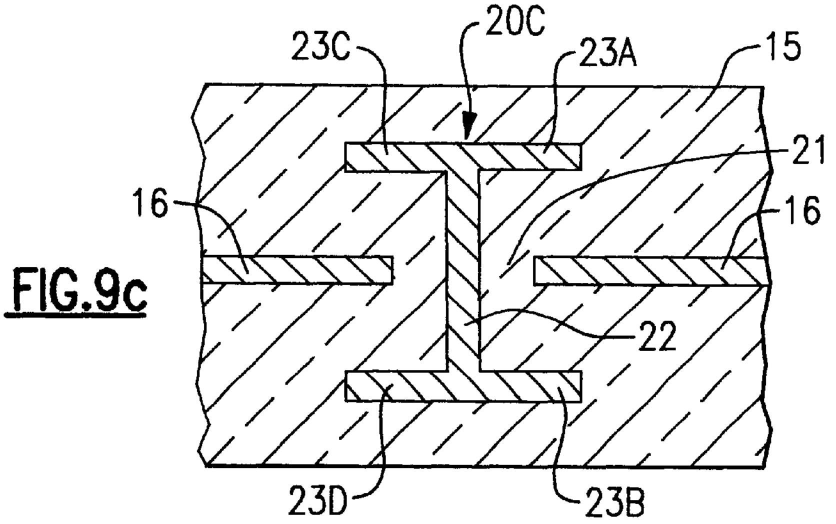

As shown in FIG. 9(*b*), a resistance control layer 20B can be provided in an area 21 such that the layer 20B is tilted to the extending plane of the resistance element 16 by a given angle. Thereby the detour distance of the leak current can be made to be longer. In this case, it is preferable that the tilted angle of the resistance control layer 20B to the extending plane of the resistance heating element is between 30 and 90 degrees.

Moreover, as shown in FIG. 9(*c*), a resistance control part 20C may be provided in the area 21. The resistance control part 20C includes a body 22, which extends in a substantially vertical direction to the extending plane of the resistance heating element 16, and projecting parts 23A, 23B, 23C, and 23D from the body 22. By providing the projecting parts extending in the same and/or opposite direction to the heating surface as seen from the resistance heating element 16, the detour distance of the leak current can be made to be longer.

As above mentioned, according to this invention, in the heater comprising the substrate of the ceramic material with the heating surface to treat an object to be heated on the substrate, the heating element embedded in the substrate, the operational conditions of every part of the heater or the operational conditions of the heater with the passage of time can be stabilized.

What is claimed:

1. A method of manufacturing a heater comprising a ceramic substrate having a heating surface to treat a substance to be heated on the substrate, comprising the steps of:

providing a first ceramic material, having a first volume resistivity, to form said substrate;

providing a second ceramic material, having a second volume resistivity higher than said first volume resistivity, to form a resistance control part;

embedding a heating element in at least one of said first and second ceramic materials; and hot pressing said first ceramic material, said second ceramic material and said heating element to form said heater.

2. The method of claim 1, wherein the resistance control part is provided between the heating surface of the substrate and the heating element.

3. The method of claim 2, wherein the heating element is embedded in the first ceramic material and is not in contact with the resistance control part.

4. The method of claim 2, further comprising the step of embedding a conducting part in the substrate between the resistance control part and the heating surface of the substrate.

5. The method of claim 2, further comprising the step of embedding a conducting part in the resistance control part.

6. The method of claim 1, wherein the heating element is embedded in the first ceramic material and is not in contact with the resistance control part.

7. The method of claim 1, further comprising the step of embedding a conducting part in the substrate between the resistance control part and the heating surface of the substrate.

8. The method of claim 1, further comprising the step of embedding a conducting part in the resistance control part.

9. The method of claim 1, wherein the first ceramic material comprises an aluminum nitride-based ceramic material and the main component of the second ceramic material comprises a ceramic material selected from the group consisting of alumina, silicon nitride, boron nitride, magnesium oxide, silicon oxide or yttrium oxide.

10. The method of claim 9, wherein the first ceramic material comprises an aluminum nitride-based ceramic material having substantially neither magnesium nor lithium and the second ceramic material comprises an aluminum nitride-based ceramic material containing not less than 0.5 wt % of magnesium as calculated in the form of magnesium oxide.

11. The method of claim 9, wherein the first ceramic material comprises an aluminum nitride-based ceramic material having substantially neither magnesium nor lithium and the second ceramic material comprises an aluminum nitride-based ceramic material containing 100 ppm through 500 ppm of lithium.

12. The method of claim 1, wherein an oxynitride or an oxide made of aluminum and components of the resistance control part exists at an interface between the first ceramic material and the resistance control part.

13. The method of claim 12, wherein the first ceramic material comprises an aluminum nitride-based ceramic material having substantially neither magnesium nor lithium and the second ceramic material comprises an aluminum nitride-based ceramic material containing not less than 0.5 wt % of magnesium as calculated in the form of magnesium oxide.

14. The method of claim 12 wherein the first ceramic material comprises an aluminum nitride-based ceramic material having substantially neither magnesium nor lithium and the second ceramic material comprises an aluminum nitride-based ceramic material containing 100 ppm through 500 ppm of lithium.

15. The method of claim 1, wherein the hot-pressing is performed at a pressure of at least 20 $kgf/cm^2$.

* * * * *